(12) United States Patent
Kuramochi et al.

(10) Patent No.: US 10,666,241 B2
(45) Date of Patent: May 26, 2020

(54) VARIABLE DELAY CIRCUIT

(71) Applicants: ROHM CO., LTD., Kyoto-shi, Kyoto (JP); Stichting IMEC Nederland, Eindhoven (NL)

(72) Inventors: Takashi Kuramochi, Kyoto (JP); Yao Hong Liu, Eindhoven (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 16/194,150

(22) Filed: Nov. 16, 2018

(65) Prior Publication Data
US 2019/0158080 A1    May 23, 2019

(30) Foreign Application Priority Data
Nov. 17, 2017   (JP) .................... 2017-222105

(51) Int. Cl.
| | | |
|---|---|---|
| *H03K 5/131* | (2014.01) |
| *H03K 5/153* | (2006.01) |
| *H03L 7/085* | (2006.01) |
| *H03L 7/197* | (2006.01) |
| *H03M 1/82* | (2006.01) |
| *H03K 5/00* | (2006.01) |

(52) U.S. Cl.
CPC .............. *H03K 5/131* (2013.01); *H03K 5/153* (2013.01); *H03L 7/085* (2013.01); *H03L 7/1974* (2013.01); *H03M 1/82* (2013.01); *H03K 2005/00058* (2013.01)

(58) Field of Classification Search
CPC ........ H03K 5/131; H03K 5/153; H03K 5/133; H03K 5/134; H03K 2005/00058; H03M 1/82; H03M 1/822; H03L 7/1974; H03L 7/085
See application file for complete search history.

(56) References Cited

U.S. PATENT DOCUMENTS

2008/0191750 A1*   8/2008   Wang ..................... H03L 7/0812
                                                                     327/106

FOREIGN PATENT DOCUMENTS

| JP | 2005-229548 | 8/2005 |
| JP | 5591914 | 11/2010 |

* cited by examiner

*Primary Examiner* — Jung Kim
(74) *Attorney, Agent, or Firm* — Knobbe Martens Olson & Bear LLP

(57) ABSTRACT

A variable delay circuit, which includes a digital-to-time converter (DTC) circuit and a controller, is disclosed. The DTC circuit includes a plurality of capacitors and a plurality of MOS switches that are turned on and off according to a control code. The DTC circuit receives an input pulse, applies a delay corresponding to the control code to the edge to be delayed, and outputs a delay pulse. The controller supplies a valid code indicating a delay amount as a control code during a period beginning from a predetermined time $T_{CONST}$ before the edge (positive edge) to be delayed of an input pulse REF up to the edge to be delayed. Further, the controller supplies, as the control code, a dummy code for turning on all of the plurality of MOS switches inside the DTC circuit immediately before the period.

20 Claims, 13 Drawing Sheets

VARIABLE DELAY CIRCUIT

CROSS-REFERENCE TO RELATED APPLICATIONS

This application claims foreign priority to Japanese Application JP2017-222105, entitled "VARIABLE DELAY CIRCUIT," filed on Nov. 17, 2017, which is incorporated herein by reference in its entirety.

BACKGROUND

Technological Field

The disclosed technology relates to a variable delay circuit.

Description of the Related Technology

A variable delay circuit which receives a pulse signal as an input and applies a delay corresponding to a digital control code to an edge of the pulse signal is used for various electronic circuits. Such a variable delay circuit is also called a digital-to-time converter (DTC), because it converts a digital control code into time information. FIG. 1 is a circuit diagram of a variable delay circuit 200R including a DTC circuit 100.

An N-bit control code DTC_CODE designating a delay amount is loaded into a flip-flop 201, and the control code DTC_CODE stored in the flip-flop 201 is supplied to the DTC circuit 100. For example, the flip-flop 201 latches the control code DTC_CODE in response to a negative edge of a reference pulse REF. Each bit of the control code DTC_CODE designates on/off of the corresponding MOS switch.

The DTC circuit 100 includes an input buffer 102, an output buffer 104, a delay line 106, a plurality of capacitors $C_1$ to $C_N$, and a plurality of MOS switches $M_1$ to $M_N$.

One ends of the plurality of capacitors $C_1$ to $C_N$ are connected to the delay line 106. The plurality of MOS switches $M_1$ to $M_N$ are provided between the other ends of the corresponding capacitors $C_1$ to $C_N$ and the ground, respectively.

The number of capacitors $C_1$ to $C_N$ seen from the delay line 106 changes in accordance with the on and off states of the MOS switches $M_1$ to $M_N$. When the capacitance values of the capacitors $C_1$ to $C_N$ are equal (Cu) and the M MOS switches are in the on state, the total capacitance $C_{DELAY}$ effectively connected to the delay line 106 and contributing to the delay is Cu×N.

The input buffer (inverter) 102 drives the delay line 106 and the capacitors connected thereto based on the reference pulse REF. The output buffer (inverter) 104 binarizes a voltage REF_B generated on the delay line 106 into a high level and a low level, and outputs a delay pulse i_dtc_o.

FIG. 2A is an operation waveform diagram of the variable delay circuit 200R in FIG. 1, and FIG. 2B is a diagram showing the relationship between the control code and the delay amount in the DTC circuit shown in FIG. 1. FIG. 2A shows how a positive edge (leading edge) of the reference pulse REF is delayed. The voltage REF_B of the delay line 106 changes with a time constant corresponding to the capacitance value $C_{DELAY}$ of the delay line 106. When the voltage REF_B of the delay line 106 crosses a threshold value of the output buffer 110, the output pulse i_dtc_o changes. As shown in FIG. 2B, the delay amount $t_{DELAY}$ linearly changes with respect to the value of the control code DTC_CODE.

As a result of examining the variable delay circuit 200R shown in FIG. 1, some problems have been recognized, such as the following:

To increase the resolution of the DTC circuit 100, it is necessary to reduce the capacitance C of the capacitor. When the capacitance C of the capacitor decreases, the influence of a drain capacitance Cd of the MOS switch M cannot be ignored relatively.

FIG. 3 is an equivalent circuit diagram of the DTC circuit 100. Consider a state in which one MOS switch $M_1$ is on and the remaining MOS switches are off. The drain capacitance Cd exists between the drain and the source of the MOS switch $M_1$.

When the MOS switch $M_1$ is on, the capacitance seen from the delay line 106 is C. When the MOS switch $M_1$ is off, the capacitance seen from the delay line 106 is a combined capacitance $(C_U*Cd)/(C_U+Cd)$ of the series connection of C and Cd. Here, the drain capacitance Cd is sufficiently smaller than the capacitance C of the capacitor $(Cd<<C_U)$. Therefore, the combined capacitance when the MOS switch is off is approximated to Cd.

FIG. 4A is a diagram showing voltage dependency of the drain capacitance. The drain capacitance Cd of the MOS switch $M_1$ depends on a drain bias voltage vb due to the reverse bias characteristic of the diode. When the MOS switch $M_1$ is off, the drain is in a high impedance state, so that the potential vb becomes undefined. Therefore, the drain capacitance Cd is an undefined factor.

FIG. 4B is a diagram showing response characteristics of the capacitance (referred to as a REF_B terminal capacitance) between the delay line 106 and the ground when the MOS switch $M_1$ is turned off. At the moment the MOS switch is turned off, the drain of the MOS switch $M_1$ becomes a floating node, and the voltage value vb at that time is undefined. It takes a very long time until the drain voltage vb stabilizes after the MOS switch is turned off, so it takes a very long time for the drain capacitance Cd to stabilize at $Cd_0$.

On the contrary, when the MOS switch is turned on, the ON resistance of the MOS switch $M_1$ immediately becomes 0Ω and the drain bias voltage vb immediately becomes 0 V. Therefore, the REF_B terminal capacitance is quickly defined as the value $C_U$ of the capacitor.

The difference in the stabilization time between turn-on of the MOS switch and turn-off of the MOS switch results in significant nonlinearity in the DTC circuit 100. FIG. 5A is a diagram showing an integral nonlinearity error (INL) when the control code DTC_CODE is swept up, and FIG. 5B is a diagram showing an integral nonlinearity error (INL) when the control code DTC_CODE is swept down. As can be seen from comparison between FIGS. 5A and 5B, the INL is largely influenced by the transition history of the control code DTC_CODE.

It should be noted that this problem should not necessarily be regarded as a general perception of those skilled in the art.

SUMMARY OF CERTAIN INVENTIVE ASPECTS

The disclosed technology has been made in view of the above problems, and one of the exemplary objects of one aspect thereof is to provide a variable delay circuit having improved characteristics.

One aspect of the disclosed technology relates to a variable delay circuit. The variable delay circuit includes a digital-to-time converter (DTC) circuit and a controller. The DTC circuit includes a plurality of capacitors and a plurality of MOS switches that are turned on and off according to the control code. The DTC circuit receives an input pulse, applies a delay corresponding to the control code to an edge to be delayed of the input pulse, and outputs a delay pulse. The controller supplies the control code to the DTC circuit. The controller supplies a valid code indicating a delay amount as the control code during a period beginning from a predetermined time before the edge to be delayed of the input pulse up to the edge to be delayed. Further, the controller supplies, as the control code, a dummy code for turning on all of the plurality of MOS switches inside the DTC circuit immediately before the period.

Another aspect of the disclosed technology relates to a PLL (Phase Locked Loop) circuit. The PLL circuit may include any one of the variable delay circuits described above. As a result, pulses with small jitter can be generated.

Another aspect of the disclosed technology relates to a frequency synthesizer. The frequency synthesizer may include the above-described PLL circuit.

Another aspect of the disclosed technology relates to a wireless communication device. The wireless communication device may include the above-described PLL circuit.

It is to be noted that any combination of the above constituent elements and modes obtained by mutually substituting constituent elements and expressions of the disclosed technology among methods, apparatuses, systems, and the like are also effective as embodiments of the disclosed technology.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF CERTAIN ILLUSTRATIVE EMBODIMENTS

Figure 1:
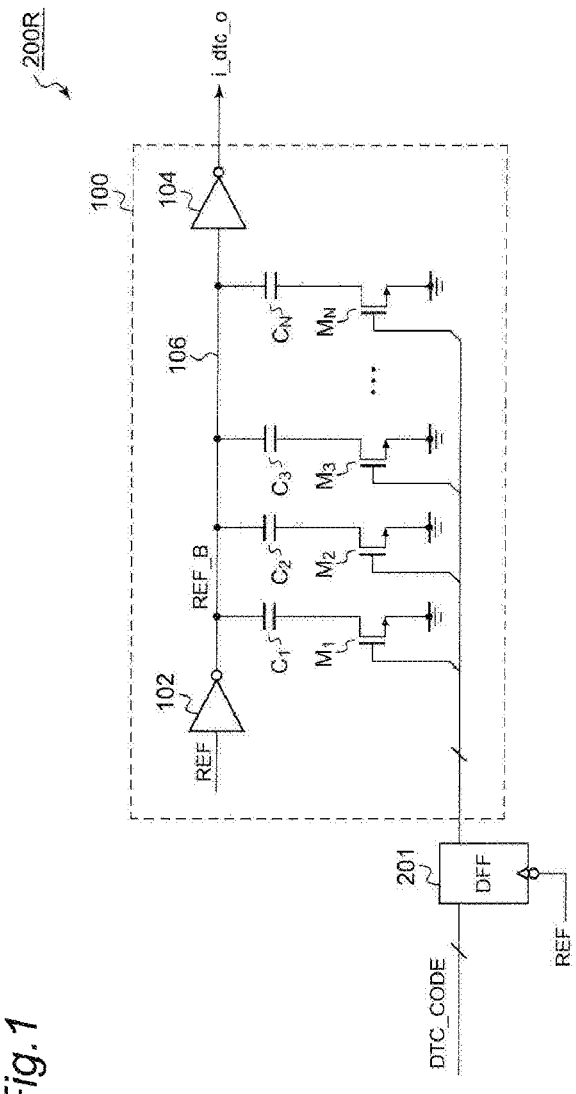
FIG. 1 is a circuit diagram of a DTC circuit.
Figure 2A:
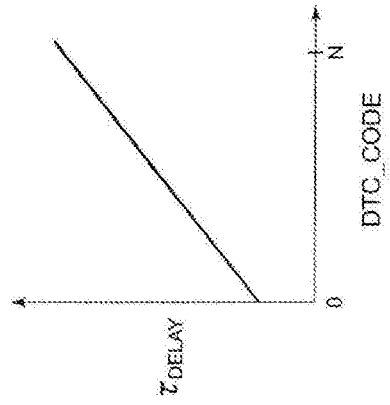
FIG. 2A is an operation waveform diagram of the DTC circuit shown in FIG. 1.
Figure 2B:
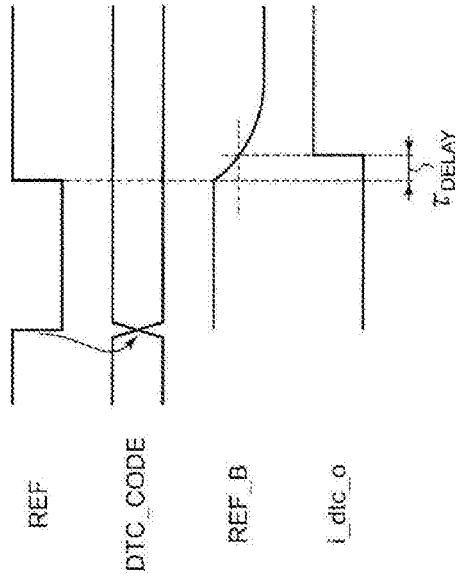
FIG. 2B is a diagram showing a relationship between a control code and a delay amount in the DTC circuit shown in FIG. 1.
Figure 3:
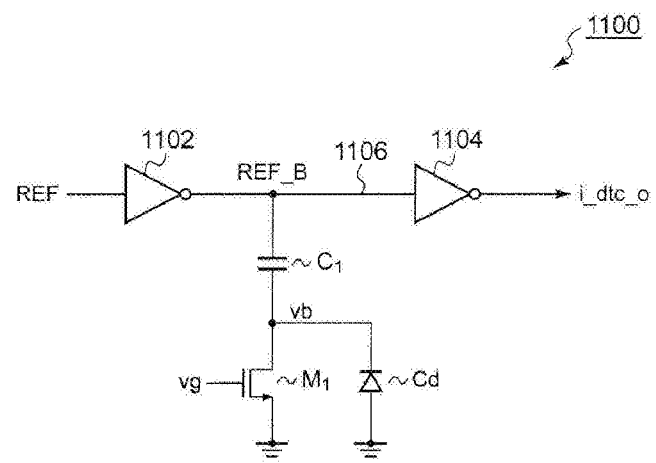
FIG. 3 is an equivalent circuit diagram of the DTC circuit.
Figure 4A:
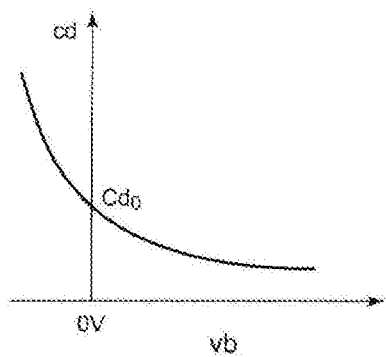
FIG. 4A is a diagram showing voltage dependency of a drain capacitance.
Figure 4B:
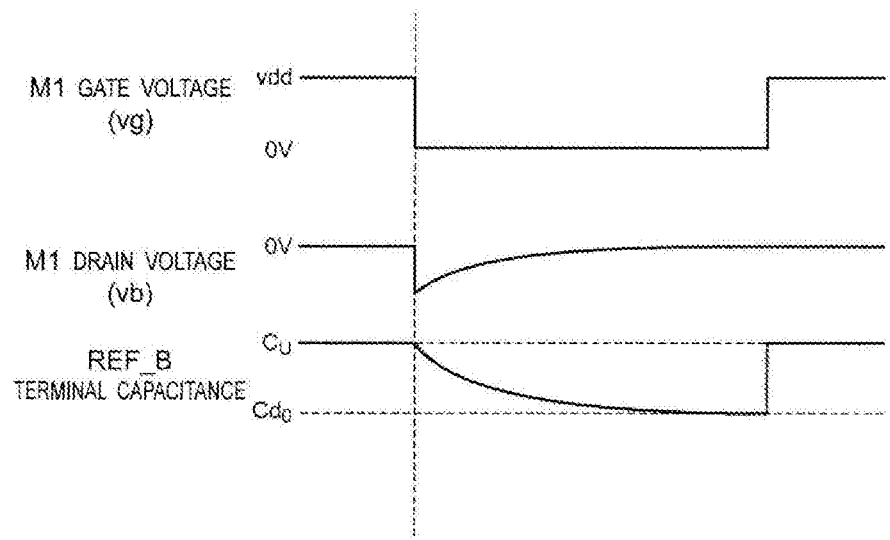
FIG. 4B is a diagram showing response characteristic of a capacitance between a delay line and a ground when a MOS switch $M_1$ is turned off.
Figure 5B:
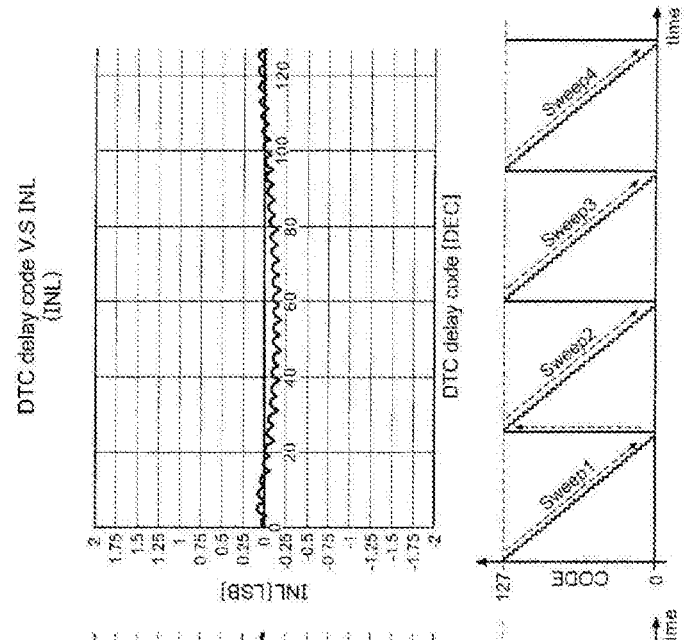
FIG. 5B is a diagram showing an integral nonlinearity error (INL) when the control code DTC_CODE is swept down.
Figure 5A:
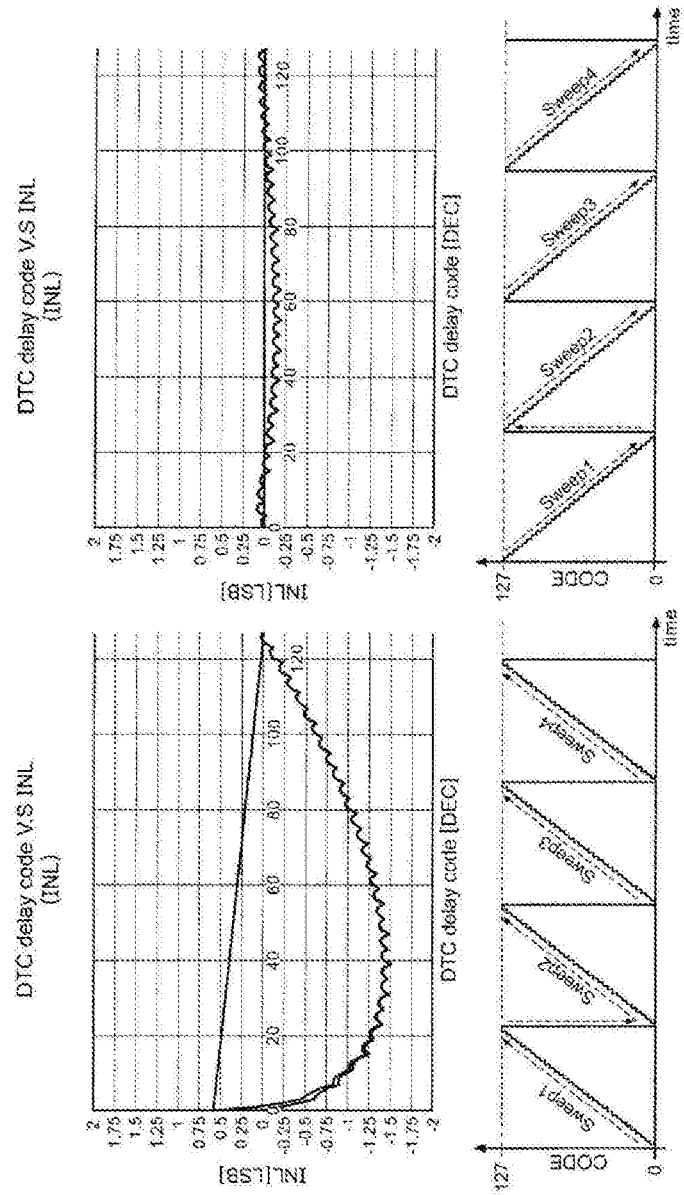
FIG. 5A is a diagram showing an integral nonlinearity error (INL) when a control code DTC_CODE is swept up.

The disclosed technology relates to a variable delay circuit. The variable delay circuit includes: a digital-to-time converter (DTC) circuit which receives an input pulse, applies a delay corresponding to a control code to an edge to be delayed, and outputs a delay pulse; and a controller which supplies the control code to the DTC circuit. The DTC circuit includes a plurality of capacitors and a plurality of MOS switches that are turned on and off according to the control code. The controller supplies a valid code indicating a delay amount as the control code during a period beginning from a predetermined time before the edge to be delayed of the input pulse up to the edge to be delayed. Further, the controller supplies, as the control code, a dummy code for turning on all of the plurality of MOS switches inside the DTC circuit immediately before the period.

In this variable delay circuit, all the MOS transistors are turned on by the dummy code to define the potential of a connection node between the MOS transistors and the capacitors. The edge to be delayed is input after a lapse of a predetermined time since the supply of the valid control code, whereby variations in the drain capacitance of the MOS transistor can be suppressed and the characteristics can be improved.

The input pulse may have a predetermined frequency. The predetermined time may be a half of a cycle of the input pulse. As a result, it is possible to equalize the period of time from the supply of the control code to the occurrence of the edge to be delayed in every cycle.

The dummy code may be supplied during a period in which a pulse based on the delay pulse in the previous cycle is at a predetermined level. The circuit can be simplified by generating the dummy code using the delay pulse in the previous cycle.

The controller may include a first flip-flop that stores the valid code, and a first logic gate that performs a logical operation on an output of the first flip-flop and a gate signal which is at a predetermined level during a period in which the dummy code is to be supplied, and that supplies the result of the logical operation to the DTC circuit. An OR gate can be used as the first logic gate.

A variable delay circuit according to one aspect may further include an output circuit that is provided at a subsequent stage of the DTC circuit and generates an output pulse which makes a transition to a first level in response to the delayed edge of the delay pulse and makes a transition to a second level in response to an edge, which is not to be delayed, of the input pulse.

The output circuit may include a second flip-flop having an input terminal to which a high level is input, a reset terminal to which a signal corresponding to the input pulse is input, and a clock terminal to which the delay pulse is input.

The output circuit may include a second logic gate receiving the delay pulse and the input pulse. For example, an AND gate can be used for the second logic gate when the delay pulse and the input pulse are positive logic.

Hereinafter, the disclosed technology will be described with reference to the drawings based on an embodiment(s). Identical or equivalent constituent elements, members, and processes shown in the respective drawings are denoted by the same reference symbols, and redundant description will be omitted as appropriate. In addition, the embodiment is not restrictive but illustrative of the invention, and all the features and combinations thereof described in the embodiment are not necessarily essential to the invention.

In the present description, "a state in which a member A is connected to a member B" means not only the case where the member A and the member B are physically directly connected to each other, but also the case where the members A and B are indirectly connected via another member which does not substantially affect the electrical connection state between them or impair the function and effect provided by the connection between them.

Similarly, "a state in which a member C is provided between the member A and the member B" includes not only the case where the member A and the member C, or the member B and the member C, are directly connected, but also the case where the member A and the member C, or the member B and the member C, are indirectly connected via another member which does not substantially affect the electrical connection state between them or impair the function and effect provided by the connection between them.

Figure 6:
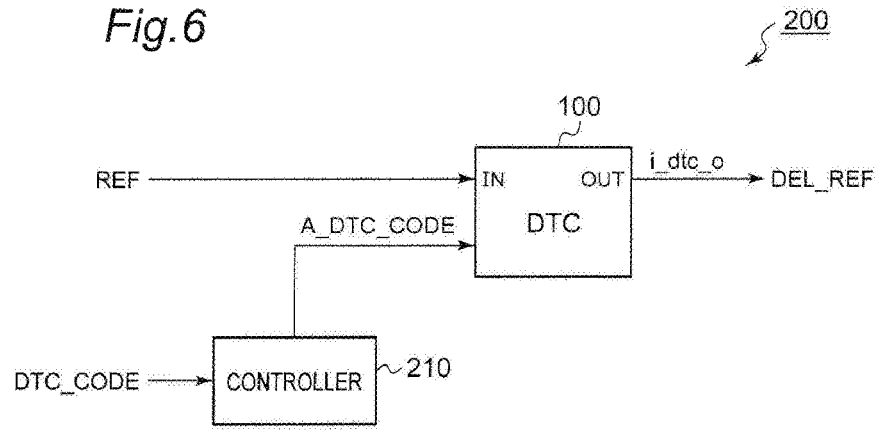
FIG. 6 is a circuit diagram of a variable delay circuit according to an embodiment.

FIG. 6 is a circuit diagram of a variable delay circuit 200 according to the embodiment. The variable delay circuit 200 applies a delay corresponding to an externally applied control code (external control code) DTC_CODE to an edge to be delayed of an input pulse REF, and outputs a delayed output pulse DEL_REF. In the present embodiment, the edge to be delayed is a positive edge (leading edge).

The variable delay circuit 200 includes a controller 210 in addition to a digital-to-time converter (DTC) circuit 100.

The DTC circuit 100 receives the input pulse REF, applies a delay corresponding to a control code A_DTC_CODE to the edge to be delayed of the input pulse REF, and outputs a delay pulse i_dtc_o. The DTC circuit 100 includes a plurality of capacitors and a plurality of MOS switches that are turned on and off according to the control code A_DTC_CODE. Although the configuration of the DTC circuit 100 is not particularly limited, it can be configured similarly to the DTC circuit 100 shown in FIG. 1, for example. When the number of MOS switches is N, the number of bits of the control code A_DTC_CODE is N. The capacitances of the N capacitors are each equal to Cu. Also, the sizes (W/L) of N MOS switches are all equal, and their drain capacitances Cd are also equal.

The controller 210 receives the external control code DTC_CODE and supplies the control code A_DTC_CODE to the DTC circuit 100. The controller 210 supplies, as the control code A_DTC_CODE, a valid code (namely, external control code DTC_CODE) indicating a delay amount $t_{DELAY}$ during a period beginning from a predetermined time $T_{CONST}$ before the edge (positive edge) to be delayed of the input pulse REF up to the edge to be delayed. Further, the controller 210 supplies, as the control code A_DTC_CODE, a dummy code DUMMY_CODE for turning all of the plurality of MOS switches on inside the DTC circuit 100 immediately before the period.

For example, the i-th MOS switch is associated with the lower i-th bit A_DTC_CODE [i−1] of the control code A_DTC_CODE [N−1:0], and is turned on when the value is 1 and turned off when the value is 0. At this time, the dummy code DUMMY_CODE [N−1:0] is [111 . . . 1] (all 1).

Figure 7:
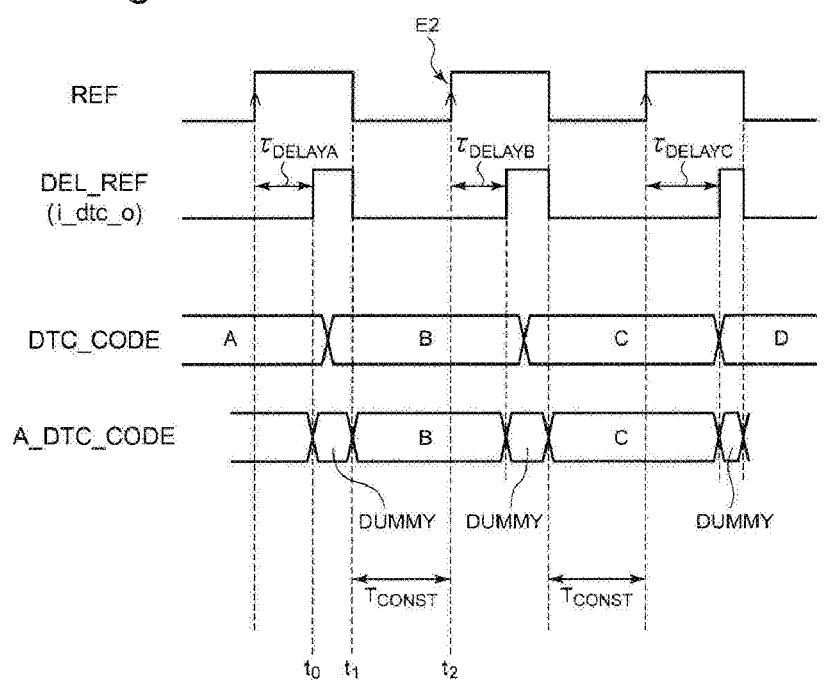
FIG. 7 is a time chart showing the operation of the variable delay circuit shown in FIG. 6.

This is the basic configuration of the variable delay circuit 200. Next, the operation of the variable delay circuit 200 will be described. FIG. 7 is a time chart showing the operation of the variable delay circuit 200 shown in FIG. 6.

The external control code DTC_CODE is updated with the same cycle as the input pulse REF. The update timing is not particularly limited. In the figure, A, B, C, and D schematically show that the value of the external control code DTC_CODE can change for each cycle, and delay amounts corresponding to the values A, B, C, and D are indicated as $\tau_{DELAYA}$, $\tau_{DELAYB}$, $\tau_{DELAYC}$, $\tau_{DELAYD}$, respectively.

In the second cycle, the control code A_DTC_CODE for the edge E2 to be delayed of the input pulse REF is determined at a time $t_1$ that is earlier than a time $t_2$ of the edge E2 by a predetermined time $T_{CONST}$. That is, it is guaranteed that the edge E2 to be delayed of the input pulse REF occurs after a lapse of the predetermined time $T_{CONST}$ from the time $t_1$ at which the valid control code B is supplied.

During the period from $t_0$ to $t_1$ immediately before the time $t_1$), the dummy code DUMMY_CODE (all 1) is supplied as the control code A_DTC_CODE.

Figure 8A:
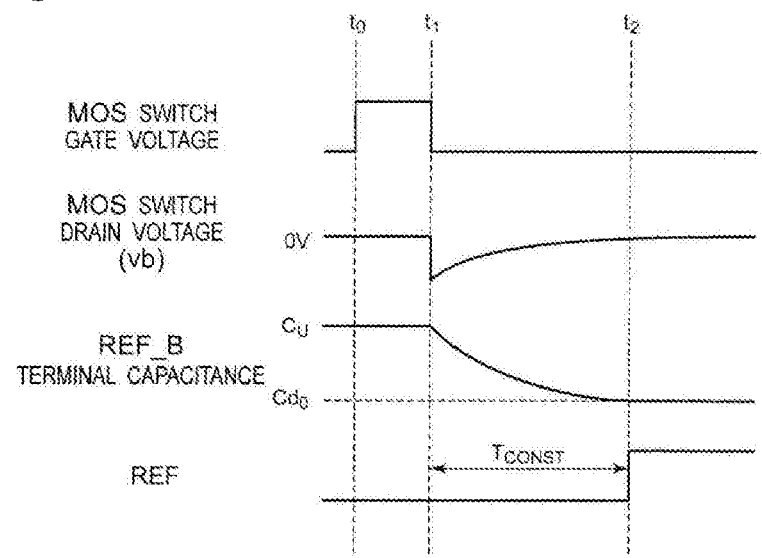
FIGS. 8A and 8B are time charts showing the operation of a single MOS transistor.
Figure 8B:
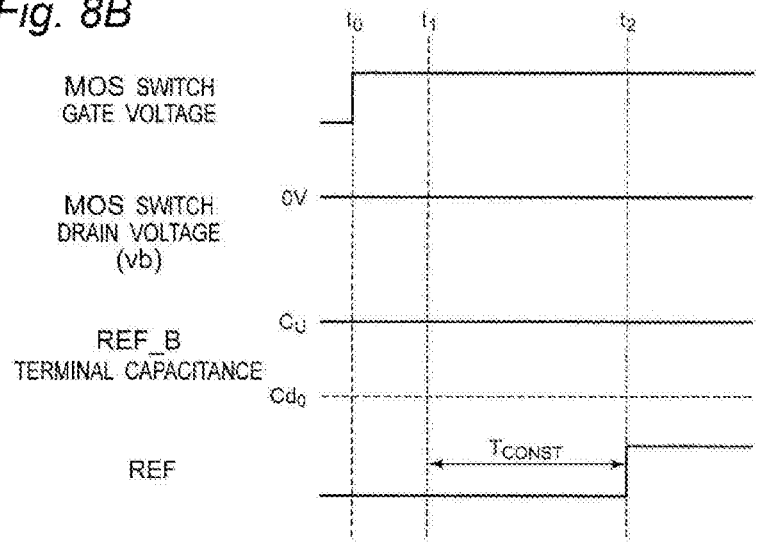

FIGS. 8A and 8B are time charts showing the operation of a single MOS transistor.

The operation when the value of the corresponding bit of the control code DTC_CODE is 0 will be described with reference to FIG. 8A. During the period from to $t_0$ $t_1$, the MOS transistor is turned on by the dummy code DUMMY_CODE. As a result, the potential of the connection node between the MOS transistor and the capacitor (that is, the drain voltage vb) is determined as 0 V.

At the time $t_1$, the MOS transistor is turned off by the corresponding bit (value 0) of the control code DTC_CODE. The drain voltage vb becomes a negative voltage immediately after the MOS transistor is turned off, and then converges to 0 V. The REF_B terminal capacitance converges to the value $Cd_0$ according to the change in the drain voltage vb. The edge E to be delayed of the input pulse REF occurs after a lapse of the predetermined time $T_{CONST}$ from the time $t_1$, and therefore, it is guaranteed that the REF_B terminal capacitance at the timing $t_2$ of the edge E assumes a predetermined value. In FIG. 8A, the predetermined time $T_{CONST}$ is equal to or longer than the stabilization time of the drain voltage vb, and thus, the REF_B terminal capacitance at the timing $t_2$ of the edge E is $Cd_0$.

Even if the predetermined time $T_{CONST}$ is set to be shorter than the stabilization time of the drain voltage vb, the REF_B terminal capacitance at the timing $t_2$ of the edge E is uniquely determined.

The operation when the value of the corresponding bit of the control code DTC_CODE is 1 will be described with reference to FIG. 8B. During the period from $t_0$ to $t_1$, the MOS transistor is turned on by the dummy code DUMMY_CODE. As a result, the potential of the connection node between the MOS transistor and the capacitor (that is, the drain voltage vb) is determined as 0 V, and the REF_B terminal capacitance becomes Cu.

When the corresponding bit (value 1) of the control code DTC_CODE is input at the time $t_1$, the MOS transistor maintains the on state. The drain voltage vb remains 0 V, and the REF_B terminal capacitance maintains Cu.

The above is the operation of the variable delay circuit 200. Next, advantages of the variable delay circuit 200 will be described.

According to the variable delay circuit 200, the capacitance (REF_B terminal capacitance) seen from the delay line through which the input pulse REF propagates can be determined at the timing of the edge (positive edge) to be delayed of the input pulse REF. As a result, the influence of the immediately preceding code on the delay amount $\tau_{DELAY}$ can be reduced.

Figure 9A:
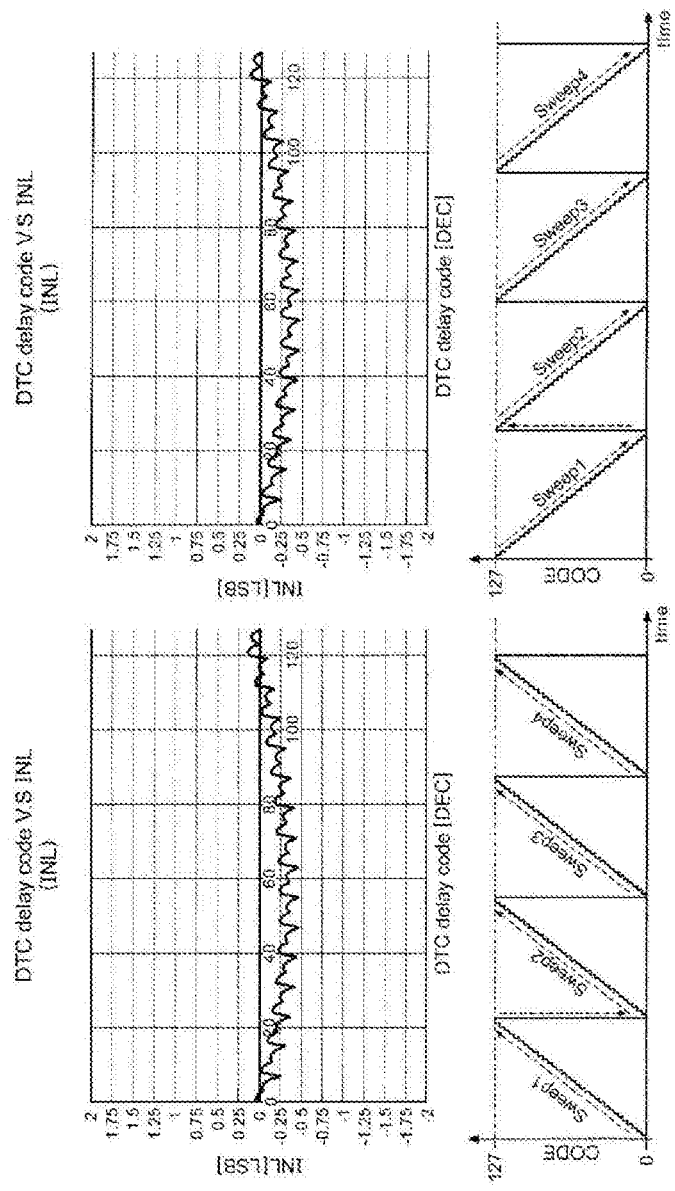
FIG. 9A is a diagram showing an integral nonlinearity error (INL) when a control code DTC_CODE is swept up.
Figure 9B:
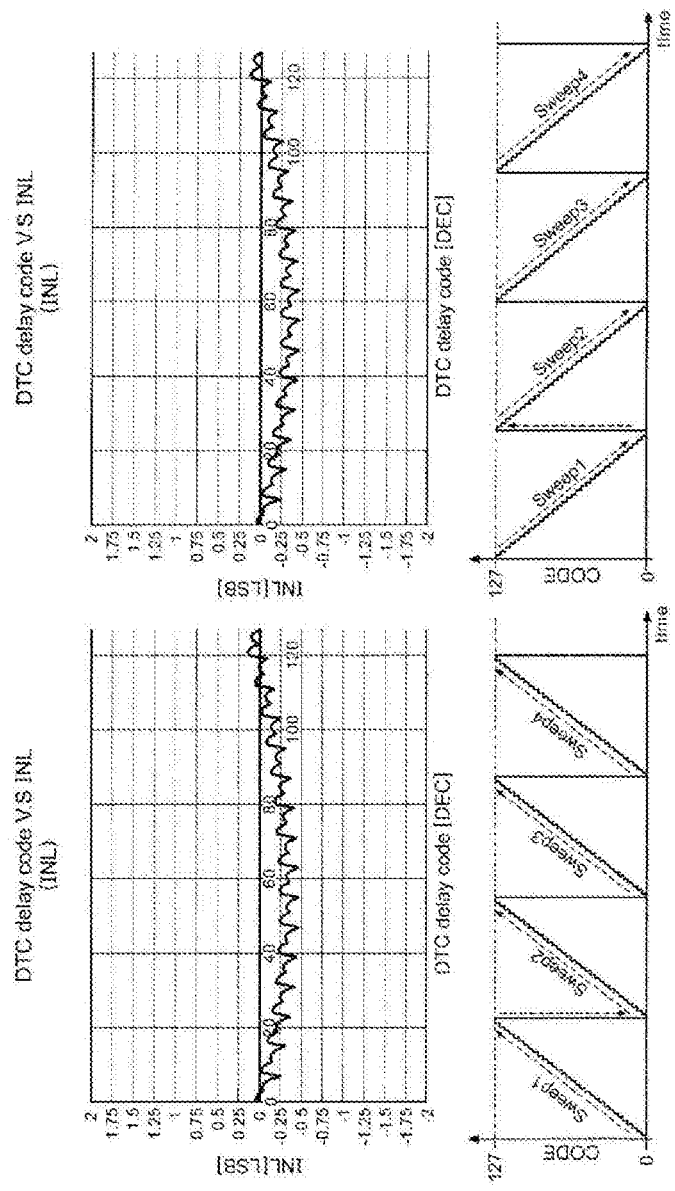
FIG. 9B is a diagram showing an integral nonlinearity error (INL) when the control code DTC_CODE is swept down.

FIG. 9A is a diagram showing an integral nonlinearity error (INL) when the control code DTC_CODE is swept up, and FIG. 9B is a diagram showing an integral nonlinearity error (INL) when the control code DTC_CODE is swept down. As can be seen from comparison between FIGS. 9A and 9B, according to the DTC circuit 100 in FIG. 6, the influence of the transition history of the control code DTC_CODE on the delay amount can be reduced.

Returning to FIG. 7, further features of the controller 210 will be described.

The input pulse REF has a predetermined frequency, and the lengths of the high period and the low period are fixed. In this case, it is preferable to use the low period of the input pulse REF as the predetermined time $T_{CONST}$. More specifically, the controller 210 changes the code A_DTC_CODE to be supplied to the DTC circuit 100 from the dummy code DUMMY_CODE to the control code DTC_CODE with the negative edge of the input pulse REF being used as a trigger. Thus, the predetermined time $T_{CONST}$ can be easily generated without additionally providing any special hardware.

Further, the controller 210 may supply the dummy code DUMMY_CODE while the delay pulse DEL_REF in the previous cycle is at a predetermined level (high). When the positive edge is to be delayed, the delay pulse DEL_DEL in the previous cycle is in a high level immediately before the time $t_1$. When this relationship is used, a timing at which the dummy code DUMMY_CODE is supplied can be easily generated.

The disclosed technology covers various kinds of devices and circuits that can be regarded as a block configuration or a circuit configuration shown in FIG. 6 and devices and circuits that can be derived from the above description, and is not limited to the disclosed embodiments. More specific configuration examples and modifications will be described below to facilitate the understanding of the spirit of the disclosed technology and the circuit operation and to clarify them, rather than to narrow the scope of the disclosed technology.

Figure 10:
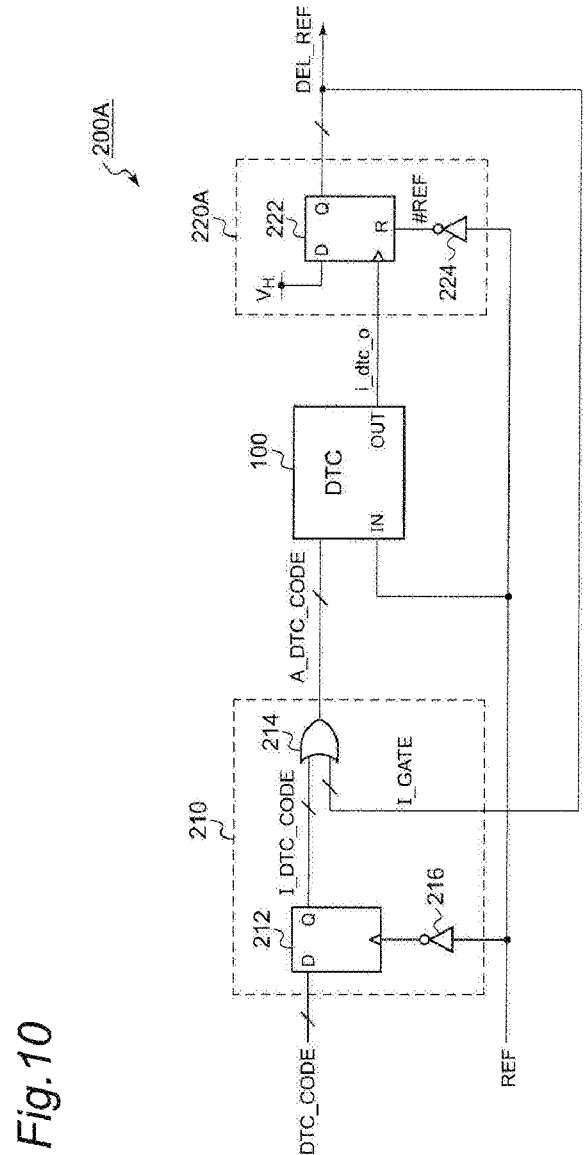
FIG. 10 is a circuit diagram of a variable delay circuit according to a first example.

FIG. 10 is a circuit diagram of a variable delay circuit 200A according to a first example. The variable delay circuit 200A further includes an output circuit 220A provided at a subsequent stage of the DTC circuit 100. The output circuit 220A generates an output pulse DEL_REF which makes a transition to a first level (for example, high level) in response to the delayed edge (positive edge) of a delay pulse i_dtc_o and makes a transition to a second level (for example, low level) in response to the edge (negative edge), which is not to be delayed, of the input pulse REF.

For example, the output circuit 220A includes a second flip-flop 222. For example, the second flip-flop 222 is a D flip-flop, and a high-level voltage $V_H$ is input to its input (D). The delay pulse i_dtc_o from the DTC circuit 100 is input to a clock terminal of the second flip-flop 222, and an input pulse #REF inverted by an inverter 224 is input to a reset terminal of the second flip-flop 222. An SR flip-flop may be used as the second flip-flop 222.

Due to the output circuit 220A being added, the jitter of the negative edge of the output pulse DEL_REF can be further suppressed.

A controller 210 includes a first flip-flop 212, a first logic gate 214, and an inverter 216. The first flip-flop 212 stores an external control code DTC_CODE used as a valid code. For example, the first flip-flop 212 may capture the external control code DTC_CODE at the negative edge timing of the input pulse REF.

The first logic gate 214 supplies, to the DTC circuit 100, a control code A_DTC_CODE obtained through a logical operation on an output I_DTC_CODE of the first flip-flop 212 and a gate signal I_GATE. The gate signal I_GATE becomes a predetermined level (for example, a high level) during a period in which the dummy code DUMMY_CODE is to be supplied. As the gate signal I_GATE, the output i_dtc_o of the DTC circuit 100 (or the output DEL_REF of the variable delay circuit 200A) can be used.

In the present example, the first logic gate 214 is an OR (logical sum) gate. When the gate signal I_GATE is high (that is, the value is 1), the control code A_DTC_CODE, which is the output of the first logic gate 214, becomes high (1) regardless of the value of I_DTC_CODE, so that the control code A_DTC_CODE becomes a dummy code. When the gate signal I_GATE is low (that is, the value is 0), the control code A_DTC_CODE which is the output of the first logic gate 214 coincides with the value of I_DTC_CODE.

According to the variable delay circuit 200A shown in FIG. 10, the operation of FIG. 7 can be achieved.

Figure 11:
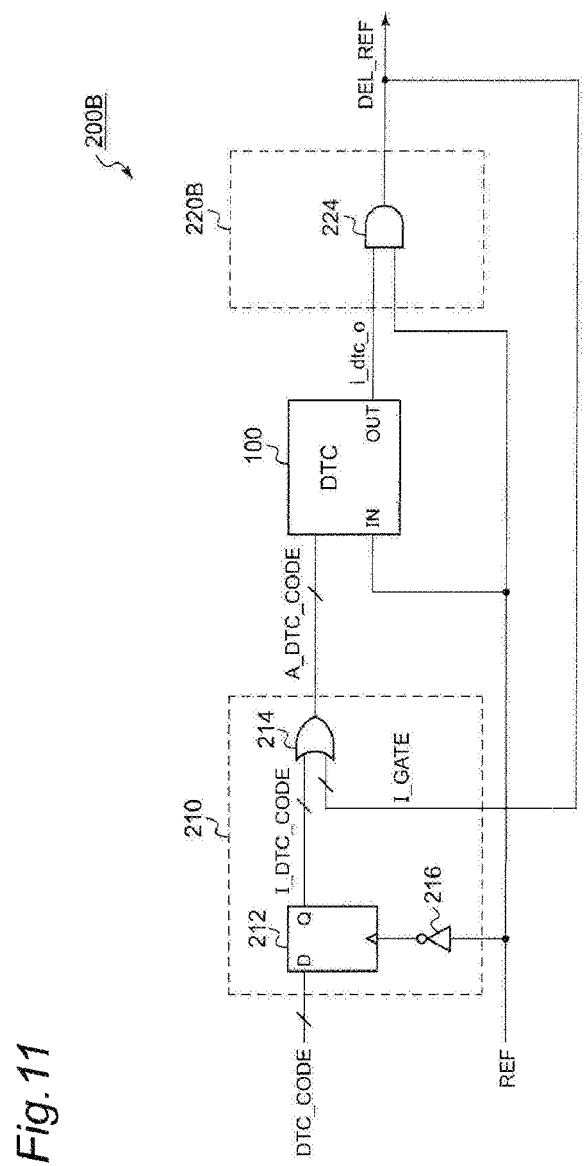
FIG. 11 is a circuit diagram of a variable delay circuit according to a second example.

FIG. 11 is a circuit diagram of a variable delay circuit 200B according to a second example. In the second example, the configuration of an output circuit 220B is different from that of the output circuit 220A in the first example. The output circuit 220B includes a second logic gate 224. The second logic gate 224 receives a delay pulse i_dtc_o and an input pulse REF and performs a logical operation on them to generate an output pulse DEL_REF. For example, the second logic gate 224 is an AND gate.

According to the variable delay circuit 200B in FIG. 11, the operation of FIG. 7 can be achieved. Since a flip-flop is not used for the output circuit 220A, the circuit configuration is simple, and jitter (noise) added to the output pulse DEL_REF can be reduced. Further, this circuit can easily respond to a high-frequency input pulse REF.

Figure 12:
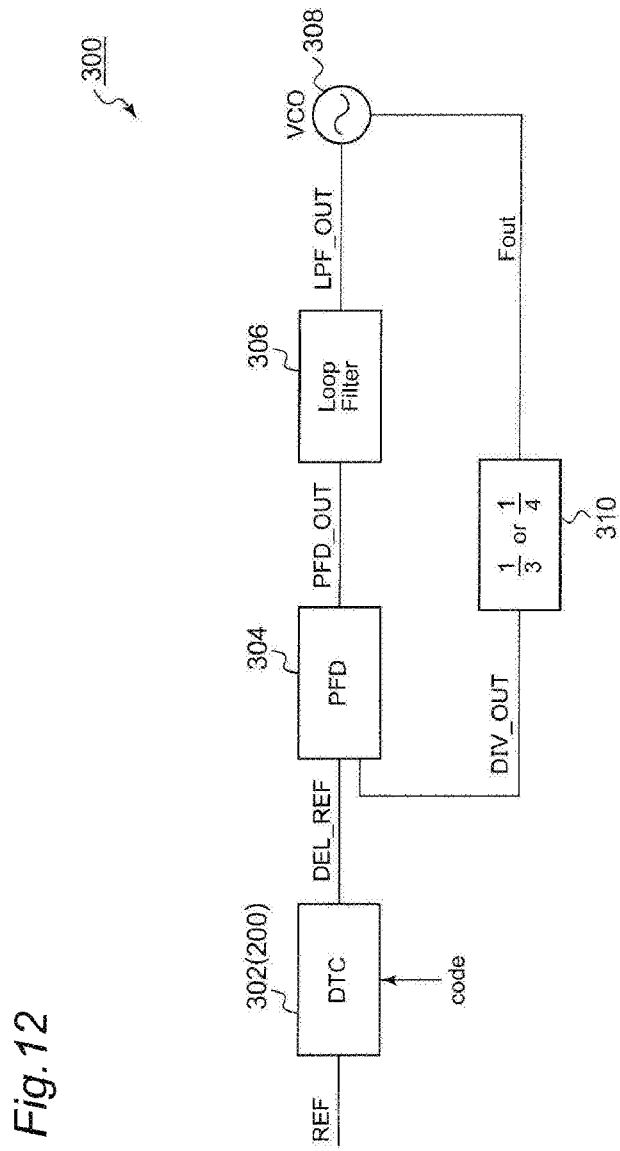
FIG. 12 is a block diagram of a PLL frequency synthesizer using a fractional-N type PLL circuit.

Next, the use of the variable delay circuit 200 will be described. FIG. 12 is a block diagram of a PLL (Phase Locked Loop) frequency synthesizer 300 using a fractional-N type PLL circuit. The PLL frequency synthesizer 300 includes a DTC circuit 302, a PFD (Phase-Frequency Detector) circuit 304, a loop filter 306, a VCO (voltage-controlled oscillator) 308, and a programmable frequency divider 310.

The DTC circuit 302 is a block corresponding to the above-described variable delay circuit 200 and applies a delay corresponding to a code to an edge (for example, positive edge) of a reference clock REF.

The VCO 308 oscillates at a frequency corresponding to an output signal LPF_OUT from the loop filter 306. The programmable frequency divider 310 divides the output Fout of the VCO 308 at a frequency division ratio that changes between two values (⅓ or ¼) in a time division manner to generate a DIV_OUT signal. The PFD circuit 304 detects the phase difference between the positive edge of the DEL_REF signal and the positive edge of the DIV_OUT signal and generates a control signal PFD_OUT according to the phase difference. The PFD_OUT signal is smoothed by the loop filter 306, and the LPF_OUT signal is generated.

Figure 13:
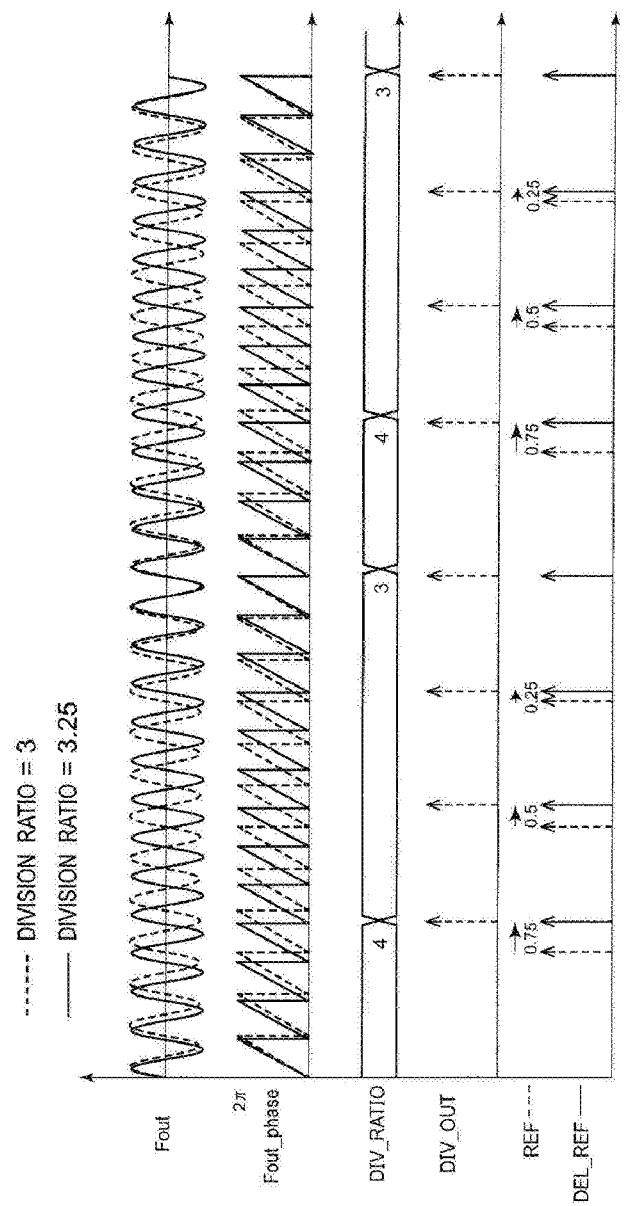
FIG. 13 is an operation waveform diagram of the PLL frequency synthesizer shown in FIG. 12.

The above is the configuration of the PLL frequency synthesizer 300. FIG. 13 is an operation waveform diagram of the PLL frequency synthesizer 300 shown in FIG. 12. The operation when the division ratio N=3.25 (frequency is 1/3.25) is indicated by a solid line. For comparison, the operation of an integer-N type PLL circuit (N=3) is also shown. In order to obtain a division ratio of 3.25, the division ratio (DIV_RATIO) of the programmable frequency divider 310 temporally takes the values 3 and 4 at a ratio of 3:1.

Focusing on the relationship between the phase (Fout_phase) of the output signal Fout and the positive edge of the reference clock REF, the phase Fout_phase of the output signal Fout advances $3.25 \times 2\pi$ [rad] each time the positive edge of the reference clock REF occurs. Therefore, if the positive edge of the reference clock REF is delayed by $0.75 \times 2\pi$ [rad], $0.5 \times 2\pi$ [rad], $0.25 \times 2\pi$ [rad], 0 [rad] for each cycle using the DTC circuit 302, the timing of the positive edge of the delayed DEL_REF signal and the timing of the edge of the DIV_OUT signal coincide with each other. Therefore, a desired frequency division ratio of 3.25 can be obtained by feedback-controlling the phase of the DIV_OUT signal with the delayed DEL_REF signal being used as a reference.

When the above-described variable delay circuits 200 (200A, 200B) are used as the DTC circuit 302 according to the embodiment, the delay pulse DEL_REF with a stable delay amount can be obtained, and the jitter (phase noise) of the high frequency clock Fout can be suppressed.

Figure 14:
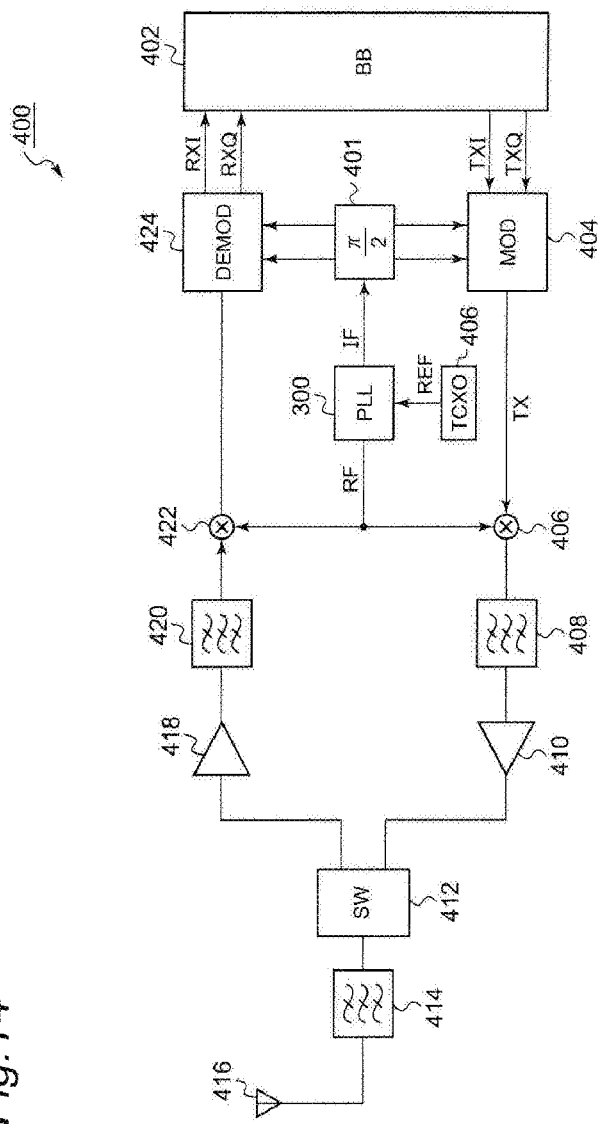
FIG. 14 is a block diagram of an electronic device having a wireless communication function.

FIG. 14 is a block diagram of an electronic device 400 having a wireless communication function. Here, a heterodyne type using an intermediate frequency IF is described as an example. However, the PLL frequency synthesizer 300 according to the embodiment can also be used for a direct-conversion frequency synthesizer.

The PLL frequency synthesizer 300 generates an IF signal having an intermediate frequency and an RF carrier signal having a radio frequency. A $\pi/2$ phase shifter 401 generates an IF signal of an in-phase component and an IF signal of a quadrature component. A quadrature modulator 404 orthogonally modulates baseband signals TXI and TXQ from a baseband IC 402 using the IF signal from the phase shifter 401.

A frequency mixer 406 up-converts the TX signal, which has been orthogonally modulated by the quadrature modulator 404, in frequency by using the RF carrier signal. The output of the frequency mixer 406 is transmitted from an antenna 416 via a bandpass filter 408, a power amplifier 410, a switch 412, and a bandpass filter 414.

Next, a receiving side will be described. The RF reception signal received by the antenna 416 is input to a frequency mixer 422 via the bandpass filter 414, the switch 412, an LNA (low noise amplifier) 418, and a bandpass filter 420. The frequency mixer 422 down-converts the RF reception signal in frequency using the RF carrier signal. A quadrature demodulator 424 orthogonally demodulates the IF reception signal from the frequency mixer 422 using the IF signal from the phase shifter 401 and supplies demodulated baseband signals RXI and RXQ to the baseband IC 402.

The above described is the configuration of the radio transceiver of the electronic device 400. According to this radio transceiver, RF carrier signals and IF signals with little phase noise can be obtained, so that the communication quality can be improved.

The disclosed technology has been described above based on the embodiment. The above embodiment is merely illustrative, and it is obvious to a person skilled in the art that various modifications are possible for the combination of constituent elements and processes in the present embodiment and that such modifications are also within the scope of the disclosed technology. Hereinafter, such modifications will be described.

In the embodiment, the edges to be delayed are set as positive edges, but not limited thereto. Negative edges (trailing edges, falling edges) may be delayed. It is possible for a person skilled in the art to delay negative edges by inverting the logic of each signal, as appropriate, or by changing the type of logic gate.

In the DTC circuit in FIG. 1, capacitors and MOS switches are provided between the delay line and the ground. However, the disclosed technology is not limited thereto. MOS switches and capacitors may be provided in series between the delay line and the power supply line.

In the embodiment, the capacitances of the plurality of capacitors in the DTC circuit 100 are all equal. However, the disclosed technology is not limited thereto. The capacitance values may be binary weighted. In this case, the sizes (W/L) of the plurality of MOS switches may also be binary weighted according to the capacitance values.

The variable delay circuit 200 according to the embodiments is not limited to be used for a PLL frequency synthesizer, and can be used for various applications in which it is desired to digitally control the edge of a pulse signal with high accuracy. Examples of other uses include a clock recovery circuit.

While the disclosed technology has been described using specific terms with reference to the embodiment, it is to be understood that the embodiment is merely illustrative of the principles and applications of the disclosed technology, and various modifications and arrangements are possible without departing from the spirit of the disclosed technology defined in appended claims.

What is claimed is:

1. A variable delay circuit, comprising:
   a digital-to-time converter (DTC) circuit comprises a plurality of capacitors and a plurality of MOS switches that are turned on and off according to a control code, the DTC circuit receiving an input pulse, applying a delay corresponding to the control code to an edge to be delayed of the input pulse, and outputting a delay pulse; and
   a controller that supplies the control code to the DTC circuit, wherein the controller supplies a valid code indicating a delay amount as the control code during a period beginning from a predetermined time before the edge to be delayed of the input pulse up to the edge to be delayed and the controller supplies a dummy code for turning on all of the plurality of MOS switches inside the DTC circuit as the control code immediately before the period.

2. The variable delay circuit according to claim 1, wherein
   the input pulse has a predetermined frequency; and
   the predetermined time is a half of a cycle of the input pulse.

3. The variable delay circuit according to claim 1, wherein the dummy code is supplied during a period in which a pulse based on the delay pulse in a previous cycle is at a predetermined level.

4. The variable delay circuit according to claim 1, wherein the controller comprises:
   a first flip-flop that stores the valid code; and
   a first logic gate that performs a logical operation on an output of the first flip-flop and a gate signal at a predetermined level during a period in which the dummy code is to be supplied, and supplies the result of the logical operation to the DTC circuit.

5. The variable delay circuit according to claim 1, further comprising an output circuit that is arranged at a subsequent stage of the DTC circuit, and generates an output pulse which makes a transition to a first level in response to a delayed edge of the delay pulse and makes a transition to a second level in response to an edge, which is not to be delayed, of the input pulse.

6. The variable delay circuit according to claim 5, wherein the output circuit comprises a second flip-flop having an input terminal to which a high level is input, a reset terminal to which a signal corresponding to the input pulse is input, and a clock terminal to which the delay pulse is input.

7. The variable delay circuit according to claim 5, wherein the output circuit comprises a second logic gate receiving the delay pulse and the input pulse.

8. A PLL (Phase Locked Loop) frequency synthesizer comprising the variable delay circuit according to claim 1.

9. An electronic device comprising the PLL frequency synthesizer according to claim 8.

10. The variable delay circuit according to claim 2, wherein the dummy code is supplied during a period in which a pulse based on the delay pulse in a previous cycle is at a predetermined level.

11. The variable delay circuit according to claim 2, wherein the controller comprises:
a first flip-flop that stores the valid code; and
a first logic gate that performs a logical operation on an output of the first flip-flop and a gate signal at a predetermined level during a period in which the dummy code is to be supplied, and supplies the result of the logical operation to the DTC circuit.

12. The variable delay circuit according to claim 3, wherein the controller comprises:
a first flip-flop that stores the valid code; and
a first logic gate that performs a logical operation on an output of the first flip-flop and a gate signal at a predetermined level during a period in which the dummy code is to be supplied, and supplies the result of the logical operation to the DTC circuit.

13. The variable delay circuit according to claim 2, further comprising an output circuit that is arranged at a subsequent stage of the DTC circuit, and generates an output pulse which makes a transition to a first level in response to a delayed edge of the delay pulse and makes a transition to a second level in response to an edge, which is not to be delayed, of the input pulse.

14. The variable delay circuit according to claim 3, further comprising an output circuit that is arranged at a subsequent stage of the DTC circuit, and generates an output pulse which makes a transition to a first level in response to a delayed edge of the delay pulse and makes a transition to a second level in response to an edge, which is not to be delayed, of the input pulse.

15. The variable delay circuit according to claim 4, further comprising an output circuit that is arranged at a subsequent stage of the DTC circuit, and generates an output pulse which makes a transition to a first level in response to a delayed edge of the delay pulse and makes a transition to a second level in response to an edge, which is not to be delayed, of the input pulse.

16. A PLL (Phase Locked Loop) frequency synthesizer comprising the variable delay circuit according to claim 2.

17. A PLL (Phase Locked Loop) frequency synthesizer comprising the variable delay circuit according to claim 3.

18. A PLL (Phase Locked Loop) frequency synthesizer comprising the variable delay circuit according to claim 4.

19. A PLL (Phase Locked Loop) frequency synthesizer comprising the variable delay circuit according to claim 5.

20. A PLL (Phase Locked Loop) frequency synthesizer comprising the variable delay circuit according to claim 6.

* * * * *